United States Patent
Mane et al.

(10) Patent No.: US 11,851,757 B2
(45) Date of Patent: Dec. 26, 2023

(54) CREATING AND PROTECTING MAGNETIC NANOMATERIALS

(71) Applicant: UCHICAGO ARGONNE, LLC, Chicago, IL (US)

(72) Inventors: Anil U. Mane, Naperville, IL (US); Yuepeng Zhang, Naperville, IL (US); Devika Choudhury, Naperville, IL (US); Jeffrey W. Elam, Elmhurst, IL (US); Kaizhong Gao, North Oaks, MN (US); John N. Hryn, Hawthorn Woods, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 627 days.

(21) Appl. No.: 16/776,702

(22) Filed: Jan. 30, 2020

(65) Prior Publication Data
US 2021/0238769 A1    Aug. 5, 2021

(51) Int. Cl.
| | | |
|---|---|---|
| C23C 16/455 | (2006.01) | |
| D01D 5/00 | (2006.01) | |
| D02G 3/16 | (2006.01) | |
| C23C 16/08 | (2006.01) | |
| C23C 16/40 | (2006.01) | |
| B22F 1/054 | (2022.01) | |
| B22F 1/16 | (2022.01) | |
| B82Y 25/00 | (2011.01) | |
| B82Y 30/00 | (2011.01) | |
| B82Y 40/00 | (2011.01) | |

(52) U.S. Cl.
CPC ...... *C23C 16/45555* (2013.01); *B22F 1/0547* (2022.01); *B22F 1/16* (2022.01); *C23C 16/08* (2013.01); *C23C 16/403* (2013.01); *C23C 16/45525* (2013.01); *D01D 5/003* (2013.01); *D02G 3/16* (2013.01); *B82Y 25/00* (2013.01); *B82Y 30/00* (2013.01); *B82Y 40/00* (2013.01)

(58) Field of Classification Search
CPC .............................................. C23C 16/45555
See application file for complete search history.

(56) References Cited

U.S. PATENT DOCUMENTS

| | | | |
|---|---|---|---|
| 2011/0236575 A1* | 9/2011 | King | C23C 16/45555 118/712 |
| 2013/0059073 A1* | 3/2013 | Jiang | C04B 35/62222 118/715 |

(Continued)

OTHER PUBLICATIONS

Nguyen-Tri, et al., "Nanocomposite Coatings: Preparation, Characterization, Properties, and Applications," International Journal of Corrosion 2018, 4749501, 19 pages (2018).

(Continued)

*Primary Examiner* — Joseph A Miller, Jr.
(74) *Attorney, Agent, or Firm* — Foley & Lardner LLP

(57) ABSTRACT

Coated nanofibers and methods for forming the same. A magnetic nanofiber is formed and a barrier coating is deposited on the magnetic nanofiber by atomic layer deposition ("ALD") process. The coated nanofiber may include a reduced magnetic nanostructure and a barrier coating comprising a first oxide coating on the nanofiber, the coating being non-reactive with the magnetic polymer nanofiber, the barrier coating have a thickness of 2 nm to 12 nm.

7 Claims, 7 Drawing Sheets

(56) References Cited

U.S. PATENT DOCUMENTS

| 2015/0104565 A1* | 4/2015 | Chen | C23C 18/2033 |
| | | | 427/108 |
| 2017/0022608 A1* | 1/2017 | King | C23C 16/4417 |
| 2018/0374658 A1* | 12/2018 | Gao | H01G 11/30 |

OTHER PUBLICATIONS

Srikanth, et al., "Magnetic studies of polymer-coated Fe nanoparticles synthesized by microwave plasma polymerization," Applied Physics Letters 79(21), pp. 3503-3505 (2001).

Wang & Harrison, "Preparation of Iron Particles Coated with Silica," Journal of Colloid and Interface Science 217(1), pp. 203-207 (1999).

* cited by examiner

CREATING AND PROTECTING MAGNETIC NANOMATERIALS

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates to synthesis methods. More particularly, the present disclosure relates to systems, methods, and compositions for forming a protective coating on magnetic nanomaterials.

BACKGROUND

Magnetic nanomaterials in the form of thin films, particles, fibers, tubes, aerogels, and foams have many technologically important applications. For example, nanoscale magnetic materials comprised of transition metals (e.g., CoFe, NiCo, CoPt, CoFeC) can be synthesized using variety of material growth methods, including vacuum-based methods (e.g., chemical vapor deposition ("CVD"), atomic layer deposition ("ALD"), physical vapor deposition ("PVD")) or wet synthesis methods (e.g., solgel, spray pyrolysis, electrospinning, sonochemistry, wet impregnation). However, the usefulness of these materials is severely limited by their susceptibility to oxidation, loss of magnetism, or general degradation. In the past, the electrospinning technique has been rendered as the most simple, versatile, and effective method for nanofiber fabrication. It results in long and diametrically uniform nanofibers and thus was utilized for fabricating various magnetic nanostructures. With the electrospinning method, polymer precursor nanofibers are first developed and then are converted to oxide and then to metallic nanofibers in post-spinning annealing steps. As it is challenging to in-situ encapsulate metallic nanofibers during annealing, coating of the metallic nanofibers with a non-reactive shell is more practical. A number of different methods have been previously explored for encapsulating magnetic core materials with different metal oxides and polymers. These earlier works utilized methods like sol-gel technique and microwave plasma for fabricating and encapsulating the nanostructures. However, accurate thickness control in the nanometer range of the protective barriers was always a limitation in these cases, preventing further improvement in magnetic performance of the materials.

SUMMARY

At least one embodiment described herein relates to a method of forming a coated nanofiber. The method comprises: forming a magnetic nanofiber, placing the magnetic nanofiber in a reactor, and depositing a barrier coating on the magnetic nanofiber by ALD process. The ALD process includes at least one cycle of: pulsing a first metal precursor for a first metal precursor pulse time; exposing a base material of the magnetic nanofiber to the first metal precursor for a first metal precursor exposure time and at a first partial pressure, the first metal precursor binding with the base material; purging the reactor of the first metal precursor; pulsing a co-reactant precursor into the reactor for a first co-reactant pulse time; exposing the base material to the co-reactant precursor for a co-reactant precursor exposure time and at a second partial pressure; and purging the reactor of the co-reactant precursor.

Another embodiment relates to a magnetic construct. The construct includes a reduced magnetic nanostructure and a barrier coating comprising a first oxide coating on the nanofiber, the coating being non-reactive with the magnetic polymer nanofiber, the barrier coating have a thickness of 2 nm to 12 nm.

Another embodiment relates to a method of forming a coated nanofiber. The method comprises forming a magnetic nanofiber by: forming a solution with metal salts and a polymer and electrospinning the solution to form a magnetic nanofiber. The method further comprises depositing a barrier coating on the magnetic nanofiber by ALD process, including at least one cycle of: pulsing a first metal precursor into the reactor for a first metal precursor pulse time; exposing the magnetic nanofiber to the first metal precursor for a first metal precursor exposure time and at a first partial pressure, binding with the magnetic nanofiber; purging the reactor of the first metal precursor; pulsing a co-reactant precursor into the reactor for a first co-reactant pulse time; exposing the magnetic nanofiber to the co-reactant precursor for a co-reactant precursor exposure time and at a second partial pressure; and purging the reactor of the co-reactant precursor.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

DETAILED DESCRIPTION

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Figure 1:
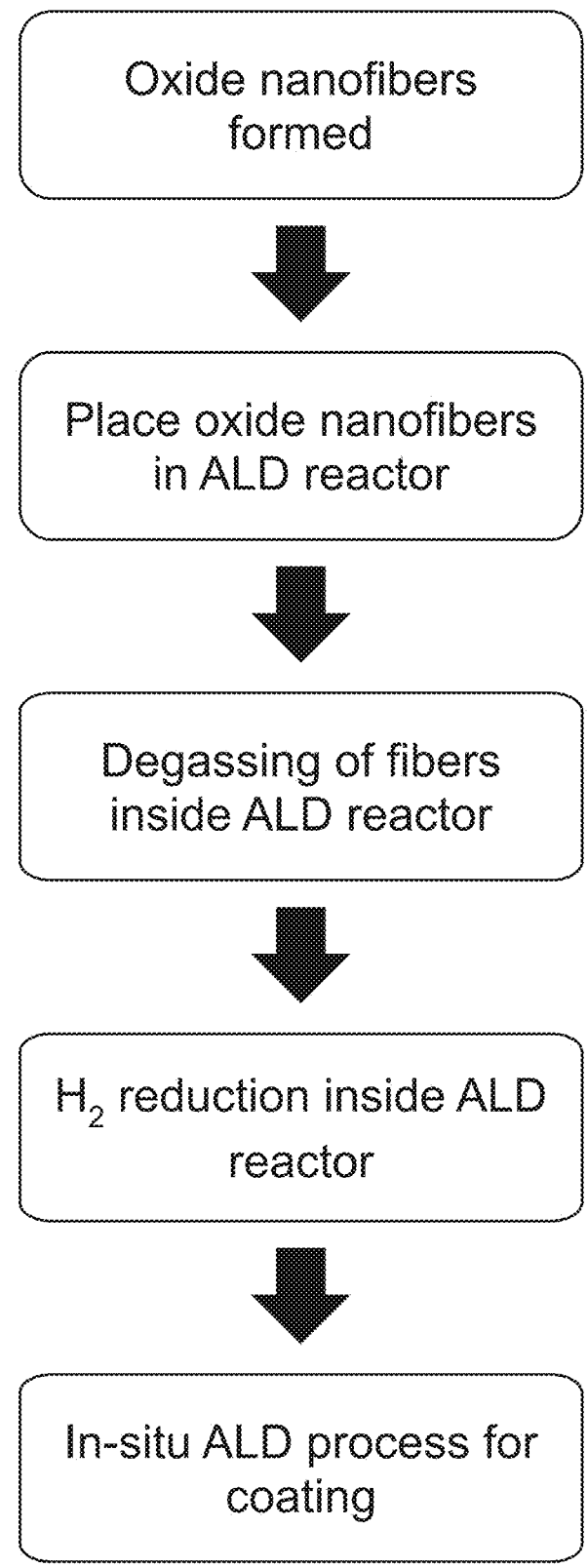
FIG. 1 illustrates one general method of producing a protected magnetic nanofiber.

Nanofibers provide many selectable and desirable properties. Magnetic nanofibers have found many applications but can suffer from property degradation over time due to oxidation or other contamination. In one embodiment, transition metal oxide nanofibers are formed. The oxide nanofiber materials are then reduced to a more ideal transition metal magnetic material. In order to preserve that reduced material, the material is encapsulated with a moisture barrier coating by atomic layer deposition. FIG. 1 illustrates one general method of producing a protected magnetic nanofiber.

Figure 2:
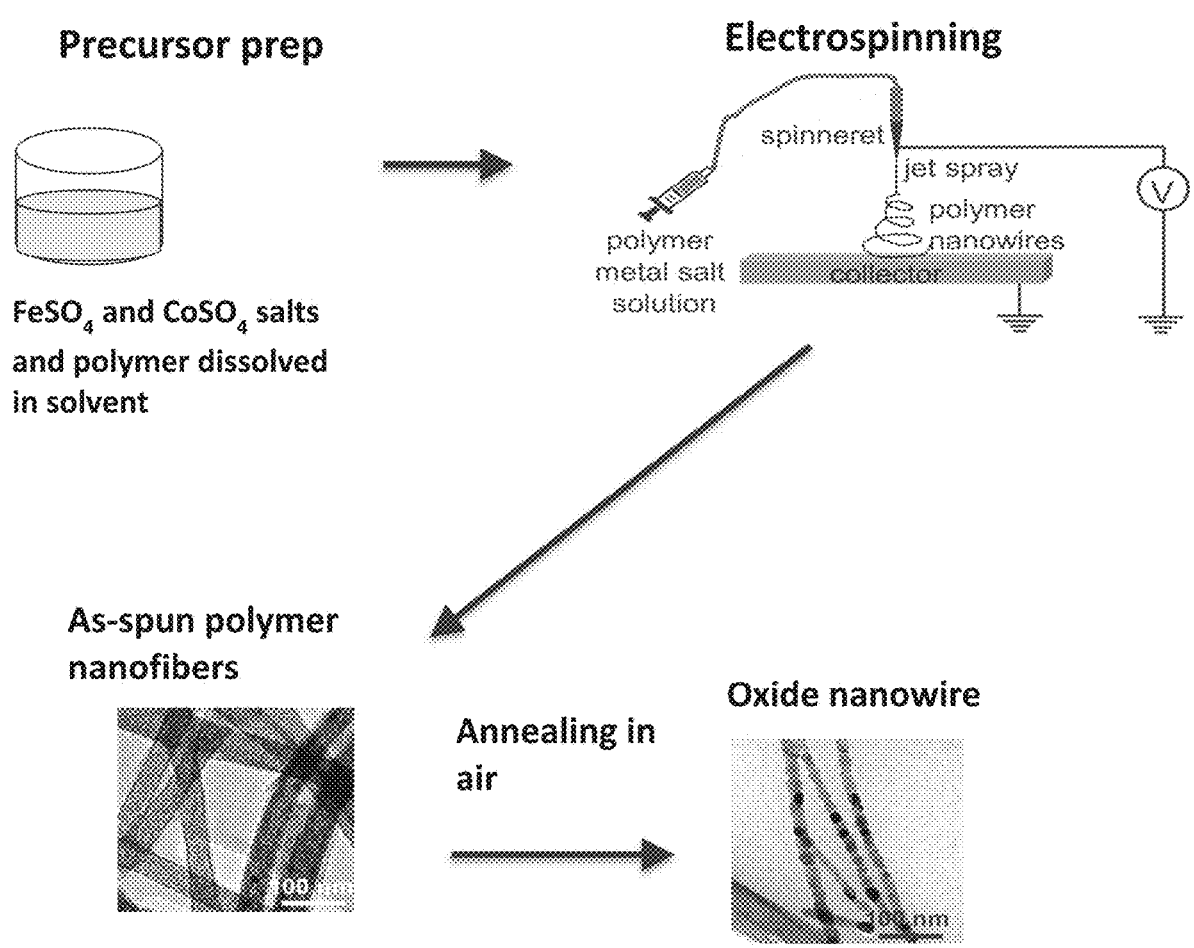
FIG. 2 illustrates a schematic of one embodiment of a method for producing an oxide nanofiber by electrospinning.

In one aspect, nanofibers are formed by conventional mechanisms, including electrospinning, phase separation, viscoelastic drawing, template synthesis, and self-assembly. FIG. 2 illustrates a schematic of one embodiment of a method for producing an oxide nanowire by electrospinning. The nanofibers may be formed by electrospinning. Electrospinning is a fiber production method which uses electric force to draw charged threads of polymer solutions. Nanofibers may be produced as known in the art using electrospinning techniques.

In another aspect, the nanofibers are reduced. In one embodiment, where the nanofiber is an oxide, the nanofiber is reduced. The reduction may be done by holding the nanofiber at an elevated temperature between 350-500° C. for a period of 3-24 hours in a reducing environment (e.g., $H_2$, $Si_2H_6$, $N_2$—$H_2$, Hydrazine, or the like).

For example, in one embodiment, $FeCoO_x$ nanofibers were kept at 375° C. for 12 hours to allow the fibers to be heated uniformly. Pure $H_2$ gas of 7 Torr partial pressure was then flowed into the reactor continuously for 1 hour for complete reduction of the oxide nanofibers. At the end of an hour, the $H_2$ gas flow was turned off and the temperature of the stage was reduced to 150° C. No significant grain growth of the nanofibers was found after $H_2$ reduction process, thus confirming the success of the reduction process without altering the microstructure of the nanofibers. The aforementioned temperature, pressure of $H_2$ gas and time is the optimized condition for obtaining complete reduction of up to 25 mg of fibers. Non-optimized conditions either resulted in incomplete reduction or destruction of the microstructure of the nanofibers. The reduced nanofibers are highly reactive to an oxidizing environment. For example, exposure to atmospheric conditions will result in oxidation and reversion to the non-reduced nanofiber.

In another aspect, the nanofibers, which may be reduced as described above, are coated with one or more barrier materials. The coating may be via ALD. ALD allows deposition of a conformal coating of barrier materials on the nanostructures with angstrom level precision of thickness unlike other deposition methods. As a result, the ultrathin nature of the ALD coating is advantageous to maintain the high magnetic moment of the coated nanofibers because the non-magnetic coating only takes a small volume fraction of the overall core-shell nanofiber composites.

In one embodiment, the coating comprises $Al_2O_3$. In further embodiment, a non-oxygen compound (e.g., $AlF_3$) may be used. Further embodiments may use known barrier materials (e.g., $TiO_2$, ZnS). The coating materials can either be non-magnetic or magnetic materials. In the case of a non-magnetic coating, the coating is expected to be thin yet still protective, so the volume fraction of the magnetic component in this core-shell composite is large. In some embodiments, a magnetic coating may be applied to introduce the functionality of the composite core-shell materials. In this case, the composition and thickness of the magnetic coating is determined by the application. Generally, the coating materials do not react with the magnetic nanofiber. However, there may be possibilities that the coating layer reacts with magnetic nanofiber to form a useful interfacial layer that introduce additional benefits such as a new interfacial materials.

The coating may be done by atomic layer deposition. The coating process results in a stabilizing material being coated to a thickness on the nanofiber. The uniqueness of ALD method compared to other thin film deposition techniques is that ALD utilizes the alternating exposures of reactive precursor vapors and a solid surface to deposit materials in an atomic layer-by-layer fashion. The ALD surface reactions are self-limiting and offers growth at low temperature on high aspect ratio structures such as nanofibers or porous materials with deep pores and a high surface area, to be coated precisely, uniformly, and conformally. Conformally is important for magnetic nanomaterials because the microstructure of the nanofibers greatly influence the magnetic properties. For example, the surface roughness could increase loss when the magnetic nanofibers are used for microwave applications. The conformal coating ensure that the coated nanofiber exhibiting similar curvature or surface morphology as the untreated fibers. The coating thickness is uniform for the entire surface of a single fibers and for all the fibers. Moreover, the broad range of ALD precursors available which allows nearly wide range of nanostructure materials to be synthesized by ALD including metals, oxides, nitrides, fluorides, sulfides, and their composites.

In one embodiment, the ALD process consists of a cycle, which may be repeated to form a supercycle, with a first precursor vapor exposure, such as 5 seconds, which may comprise an initial first precursor vapor pulse. The first precursor exposure is followed by a first precursor purge, such as 60 seconds, where the reactor is pumped to a vacuum. This results in a first precursor chemisorbed on the nanofiber surface forming half a monolayer of ALD film. This is followed by a first co-reactant exposure, which may include a co-reactant pulse, such as 5 seconds. The first co-reactant exposure is followed by a co-reactant purge, such as 60 seconds. The second co-reactant is then chemisorbed on the available surface species of the previous precursor to form a layer of the resulting compound. The material may be deposited a coating, which may be a complete layer, such as a single atomic layer or multiple layers, or a partial atomic layer, such as ad-islands. Further, additional cycles can be utilized to deposit the material to form a coating of a desired thickness. It should be appreciated that more complicated ALD schemes can be constructed as a supercycle comprising various subcycles for depositing a material as described, such as varying the parameters for any of the individual steps within a cycle.

The ALD process may be used to form the coating comprising moisture barrier materials. The first precursor may comprise known precursors for the selected barrier material. The first co-reactant may comprise known co-reactants for the first precursor to achieve deposition of the selected barrier material. In one embodiment, ALD results in an $Al_2O_3$ coating and the first precursor is trimethylaluminium ("TMA") and the first co-reactant is $H_2O$. In another embodiment, the ALD results in an $AlF_3$ layer using TMA-hydrogen fluoride-pyridine chemistry.

The coating may include one or more dopants. In addition, the ALD process may be used to deposited additional layers of a second material on top of an initial layer of material, including as alternating layer or hybrid materials. For example, a thin inner ALD coating layer that does not react with the nanofibers can be coated first, followed with a second coating that may be reactive with the nanofibers but not with the first ALD coating. The second layer may have desirable properties, aside from the reactivity with the nanofiber, such as being mechanically stronger or chemically more stable to enhance the protection effect.

The coating may have a thickness as noted above, such as controlled by the number of ALD cycles. In one embodiment, the thickness is 2 nm to 12 nm, inclusive; in a particular implementation, it is 2 nm to 7 nm. Specifically, certain materials may have a particular desired thickness, such as $Co_xFe_yO_z$ reduced to $Co_xFe_y$, and then coated conformally with 5 nm ALD $Al_2O_3$ layer using $TMA-H_2O$ chemistry or 8 nm $AlF_3$ layer with TMA as the first precursor and hydrogen fluoride ("HF") as the first co-reactant, relying upon pyridine chemistry.

Certain embodiments described herein provide a number of advantages. First, the process may utilize an oxide. Alternatively, the process may use a non-oxide, such as nitrides or sulfides, as well as a pure metallic material. Second, the process offers the possibility to use a low temperature, which prevent material microstructural change or phase transition. Third, the process allows for flexibility in the use of various materials for the nanofiber so long as they are compatible reducing atmosphere. Fourth, the process allows for the flexibility to use various type ALD protective coatings (e.g., stable oxides and non-oxides, including nitrides, metallic, etc.) to protect the magnetic properties of the nanoscale magnetic materials. Fifth, the use of ALD allows for precise thickness control of the protective coatings, which introduces least influence on magnetic properties of the core material. Finally, the process may allow for the use of nanoscale materials such as thin films, particles, fibers, tubes, aerogels, foams, mesh and various complex 3D shapes.

Notably, in one embodiment, the reduction and coating is done in the same chamber without breaking vacuum and exposing the metallic fibers to the atmosphere. That is, the reduction of the nanofiber and the coating, such as via ALD, can occur within the same sealed reactor. In case of transfer between chambers between reduction and coating, the fibers can be oxidized largely.

Experimental Results

A nanofiber material was formed in accordance with the general process shown in FIG. 2. Experiments utilized $FeSO_4$ and $CoSO_4$ salts along with a polymer in a solvent to facilitate an electrospin process and formation of polymer nanofibers. The nanofibers were annealed in air to result in $FeCoO_x$ nanofibers, degassed in an ALD reactor at 375° C. (inert Argon environment).

Figure 3A:
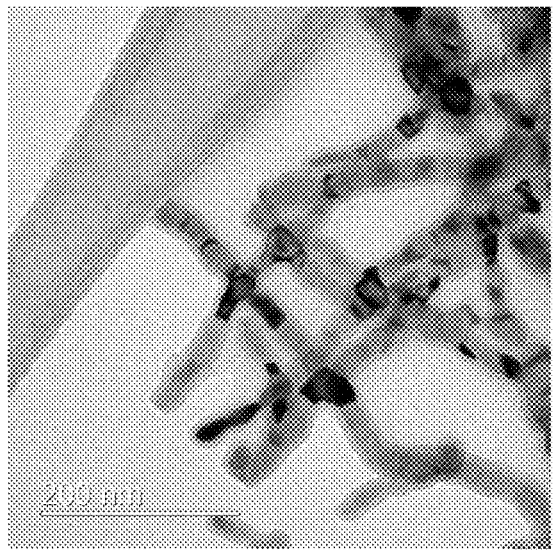
FIGS. 3A-3C show photomicrographs of the nanofibers before reduction (FIG. 3A) and after reduction and ALD coating (FIGS. 3B and 3C).
Figure 3B:
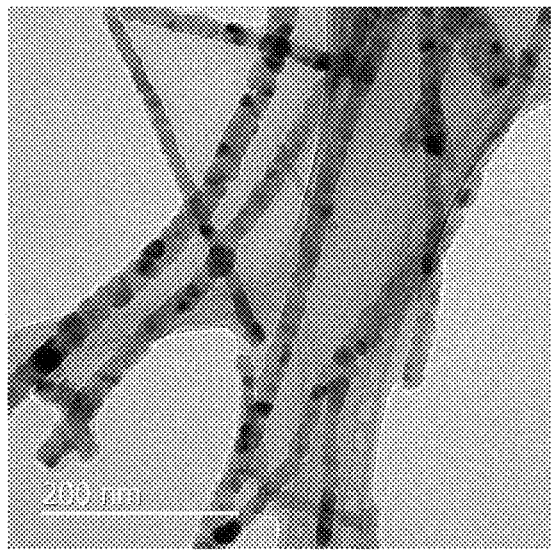
Figure 3C:
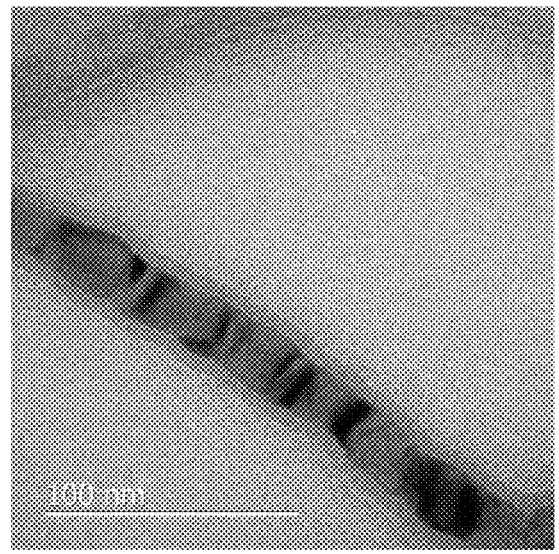

FIGS. 3A-3C show photomicrographs of the nanofibers before reduction (FIG. 3A) and after reduction and ALD coating (FIGS. 3B and 3C). Reduction was done in a hydrogen environment within the ALD reactor (375° C., 1 hour, 7 Torr). Table 1 below illustrates the process parameters used to coat/encapsulate the reduced nanofibers.

TABLE 1

| No. | Parameters | Values |
| --- | --- | --- |
| 1. | Precursors used | $TMA-H_2O$/ $TMA-HFPyridine$ |
| 2. | Deposition temperature | 150° C. |
| 3. | No. of ALD cycles | 50 |
| 4. | Purge gas | Ar |
| 5. | $Al_2O_3$ thickness | 7 nm |

Figure 4A:
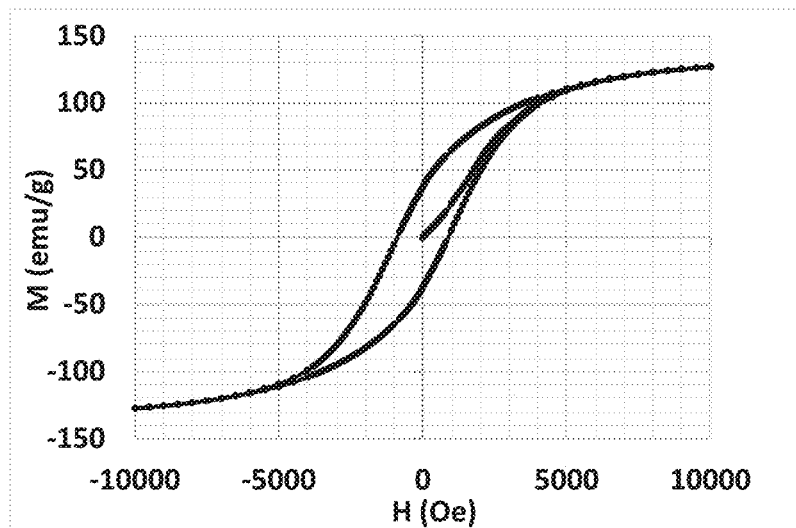
FIGS. 4A-4B are graphs of the magnetic properties of FeCo nanofibers without an ALD coating (FIG. 4A) and FeCo nanofibers with an ALD coating (FIG. 4B).
Figure 4B:
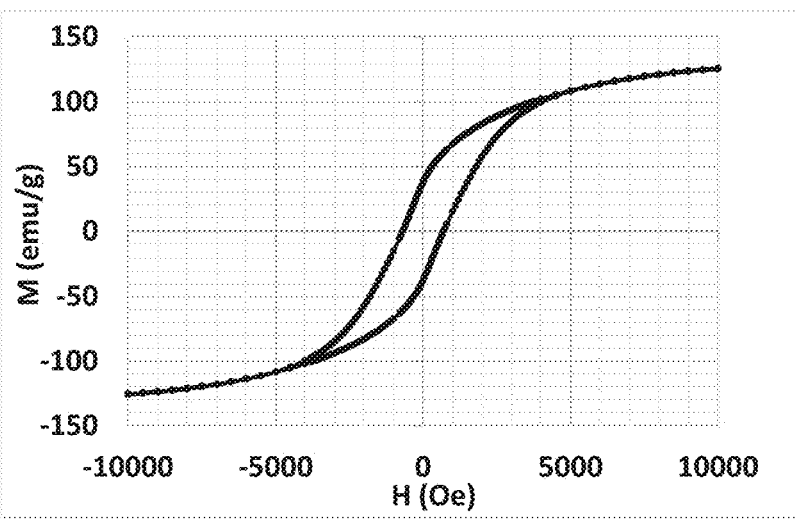

FIGS. 4A-4B are graphs of the magnetic properties of FeCo nanofibers without an ALD coating (FIG. 4A) and FeCo nanofibers with an $Al_2O_3$ coating (FIG. 4B). The FeCo nanofibers without a coating exhibiting a magnetization of 134 emu/g while the coated FeCo nanofibers exhibited a notably higher magnetization of 167 emu/g of the FeCo core. This magnetization value was obtained by subtracting the $Al_2O_3$ mass from the $FeCo-Al_2O_3$ core-shell nanofiber, which is reasonable because $Al_2O_3$ is not magnetic and the $Al_2O_3$ shell does not contribute to the measured magnetization. This data is from a single batch with measurements temporally separated as indicated.

Figure 5A:
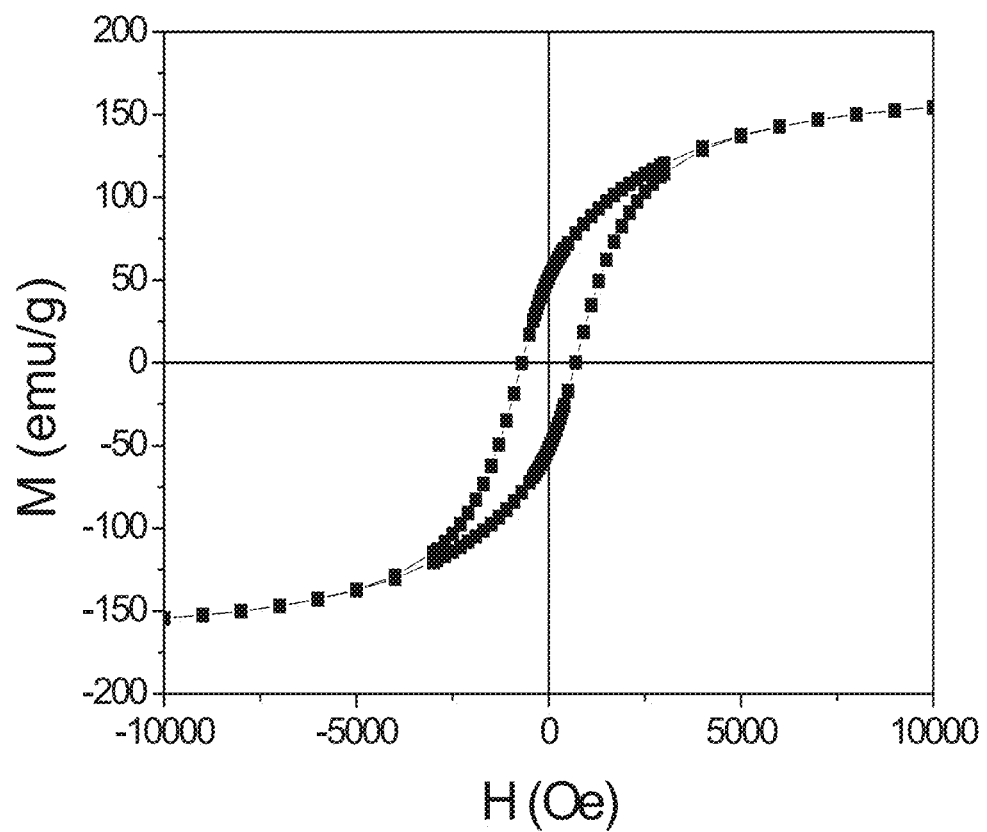
FIGS. 5A-5B illustrate an analysis of the magnetic strength of the nanofibers when coated with an $Al_2O_3$ layer (FIG. 5A) and when coated with an $AlF_3$ layer (FIG. 5B).
Figure 5B:
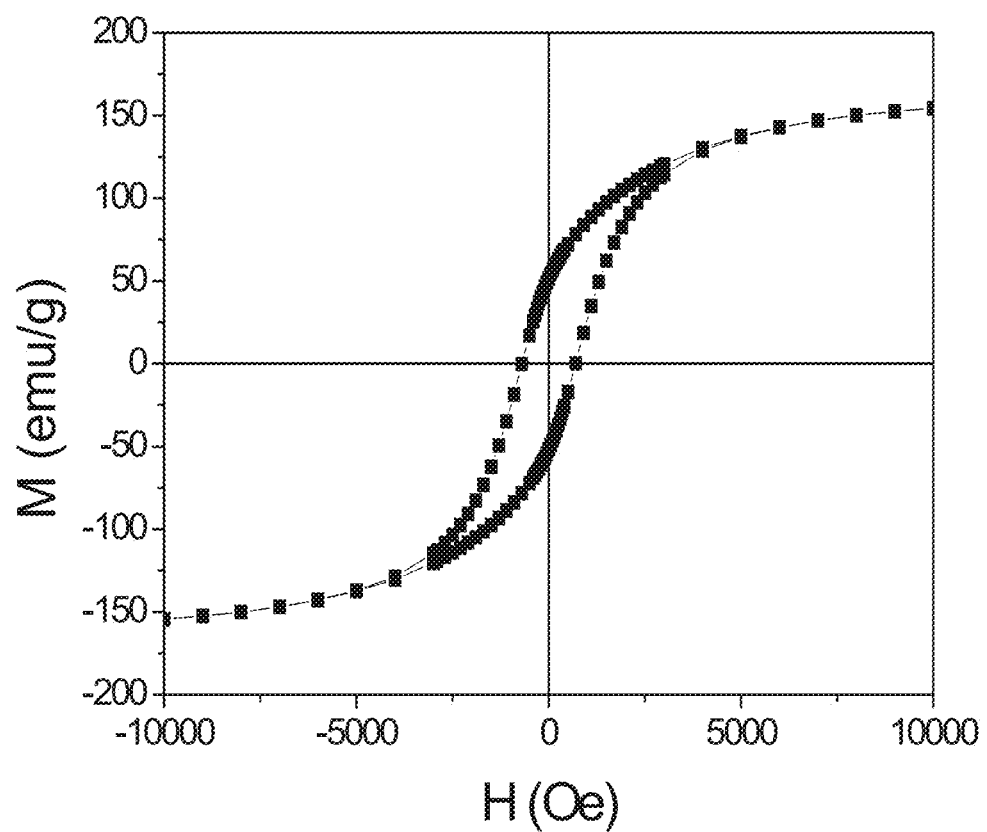

Further, experiments were done to determine whether the material used for the ALD coating may impact performance and retention of magnetization. FIGS. 5A-5B illustrate an analysis of the magnetic strength of the nanofibers when coated with an $Al_2O_3$ layer (FIG. 5A) and when coated with an $AlF_3$ layer of similar thicknesses (FIG. 5B). The $AlF_3$ coated FeCo nanofibers exhibited higher magnetization than the $Al_2O_3$ coated FeCo fibers. Note the magnetization value of the FeCo core for the $FeCo-Al_2O_3$ and FeCo—$AlF_3$ core-shell nanofibers was calculated by subtracting the mass of the $Al_2O_3$ or $AlF_3$ ALD coatings, as described in [0030]. For both $Al_2O_3$ and $AlF_3$ cases, the FeCo core has similar composition and thus is expected to show similar magnetization value. The fact that the $AlF_3$ coated FeCo core shows a higher Ms than the $Al_2O_3$ coated FeCo core indicates that $AlF_3$ does a more effective protection to the FeCo nanofibers. XPS data indicated that fibers coating with $Al_2O_3$, have some FeO component in them while those coated with $AlF_3$ are more metallic in nature. It is believed that the reason why $AlF_3$ coated fibers exhibits a higher magnetization value.

Figure 6:
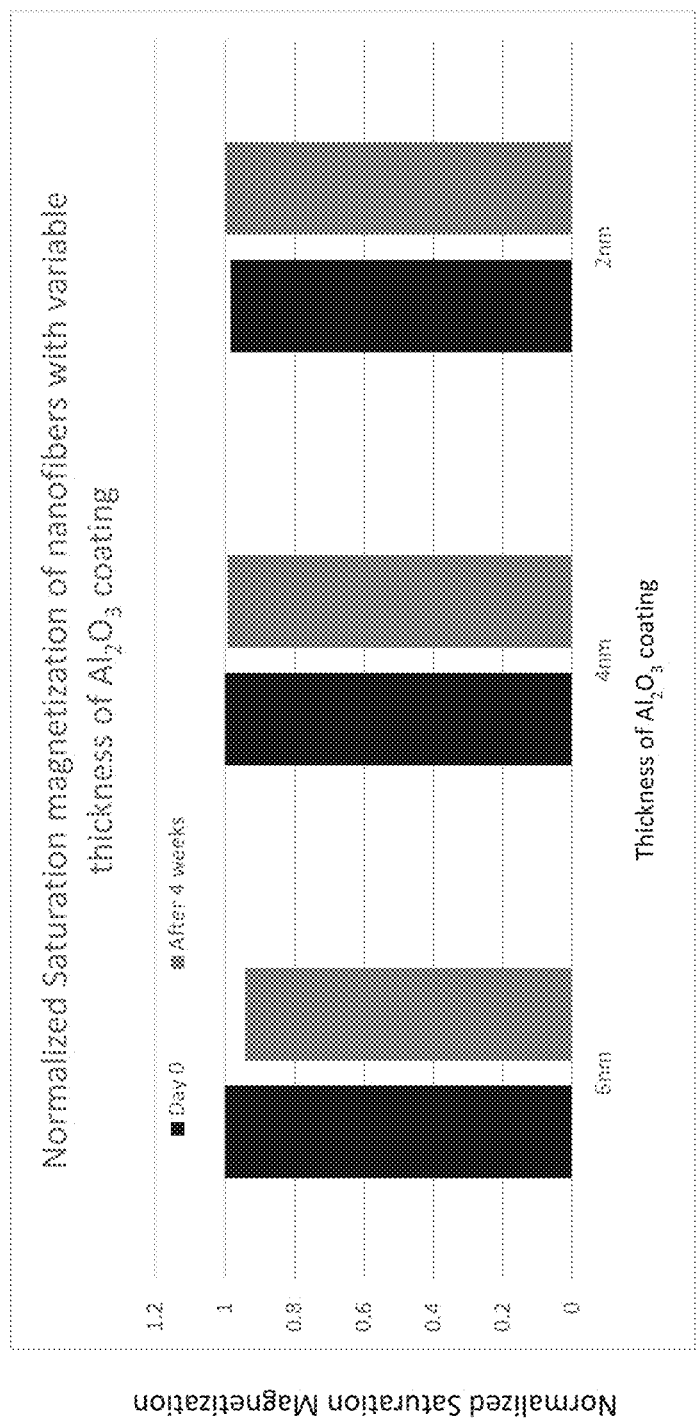
FIG. 6 shows the stability of magnetic nanofibers having various thickness of coatings. The Ms values (emu) are normalized to the max. Ms is recorded in time (i.e., day 0).

FIG. 6 shows the stability of magnetic nanofibers having various thickness of coatings. As can be seen, the magnetization is protected by all three samples. While there is no upper limit on coating thickness in terms of protective function, too thick of a coating layer will reduce the magnetic component volume fraction, which in many cases is not desirable. The same also stands for the lower limit of the coating thickness. Depending on the nucleation of the barrier material on the metallic nanostructures, the minimum thickness required to obtain a uniform conformal layer may vary. For $Al_2O_3$, it was observed that 2 nm of coating is sufficient for protecting the nanostructures.

Definitions

No claim element herein is to be construed under the provisions of 35 U.S.C. § 112(f), unless the element is expressly recited using the phrase "means for."

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:

1. A method of forming a coated nanofiber, comprising:
    forming a magnetic nanofiber by:
        forming a solution with metal salts and a polymer, and electrospinning the solution to form a magnetic nanofiber;
    reducing the magnetic nanofiber prior to depositing the first material on the magnetic nanofiber;
    placing the magnetic nanofiber in a reactor; and
    after reducing, depositing a barrier coating on the magnetic nanofiber by atomic layer deposition ("ALD") process including at least one cycle of:
        pulsing a first metal precursor for a first metal precursor pulse time,
        exposing a base material of the magnetic nanofiber to the first metal precursor for a first metal precursor exposure time and at a first partial pressure, the first metal precursor binding with the base material,
        purging the reactor of the first metal precursor,
        pulsing a co-reactant precursor into the reactor for a first co-reactant pulse time;
        exposing the base material to the co-reactant precursor for a co-reactant precursor exposure time and at a second partial pressure, and
        purging the reactor of the co-reactant precursor.

2. The method of claim 1, wherein the reduction is performed within the reactor vessel.

3. The method of claim 1, wherein the barrier coating is a magnetic coating.

4. The method of claim 1, wherein the barrier coating is a non-magnetic coating.

5. A method of forming a coated nanofiber, comprising:
    forming a magnetic nanofiber by:
        forming a solution with metal salts and a polymer, and electrospinning the solution to form a magnetic nanofiber; and
    reducing the magnetic nanofiber prior to depositing the first material on the magnetic nanofiber;
    depositing a barrier coating on the magnetic nanofiber by atomic layer deposition ("ALD") process including at least one cycle of:
        pulsing a first metal precursor into the reactor for a first metal precursor pulse time,
        exposing the magnetic nanofiber to the first metal precursor for a first metal precursor exposure time and at a first partial pressure, binding with the magnetic nanofiber,
        purging the reactor of the first metal precursor,
        pulsing a co-reactant precursor into the reactor for a first co-reactant pulse time,
        exposing the magnetic nanofiber to the co-reactant precursor for a co-reactant precursor exposure time and at a second partial pressure, and
        purging the reactor of the co-reactant precursor.

6. The method of claim 5, wherein the barrier coating is a magnetic coating.

7. The method of claim 5, wherein the barrier coating is a magnetic coating.

* * * * *